United States Patent
Bult

(10) Patent No.: US 11,309,877 B1
(45) Date of Patent: Apr. 19, 2022

(54) COMPARATOR WITH FLOATING CAPACITIVE SUPPLY

(71) Applicant: Ethernovia Inc., San Jose, CA (US)

(72) Inventor: Klaas Bult, Bosch en Duin (NL)

(73) Assignee: Ethernovia Inc., San Jose, CA (US)

( * ) Notice: Subject to any disclaimer, the term of this patent is extended or adjusted under 35 U.S.C. 154(b) by 0 days.

(21) Appl. No.: 17/150,526

(22) Filed: Jan. 15, 2021

Related U.S. Application Data

(60) Provisional application No. 62/963,731, filed on Jan. 21, 2020.

(51) Int. Cl.
*H03K 5/22* (2006.01)
*H03K 5/24* (2006.01)

(52) U.S. Cl.
CPC ...................... *H03K 5/24* (2013.01)

(58) Field of Classification Search
CPC ........ H03K 5/2481; H03K 5/249; H03K 5/24; H03K 5/2418; G01R 19/0038
USPC ...................... 327/63–77, 530–543
See application file for complete search history.

(56) References Cited

U.S. PATENT DOCUMENTS

| | | | |
|---|---|---|---|
| 9,997,254 B2* | 6/2018 | Vilas Boas | G05F 3/24 |
| 2014/0167837 A1* | 6/2014 | Yannette | G06F 21/755 |
| | | | 327/534 |
| 2015/0022169 A1* | 1/2015 | Cannankurichi Vijaya Mohan | H02M 3/07 |
| | | | 323/282 |
| 2019/0372379 A1* | 12/2019 | Nakamura | A61B 5/25 |

* cited by examiner

*Primary Examiner* — Quan Tra
(74) *Attorney, Agent, or Firm* — Schwegman Lundberg & Woessner, P.A.

(57) ABSTRACT

Disclosed are circuits and methods for a comparator with a floating capacitive supply. A capacitor is coupled between a comparator and a power supply. Two sets of electronic switches are configured in opposing operational states to shift the configuration of the circuit between a charging configuration and a decision configuration. In the charging configuration, the capacitor draws current from the power supply. In the decision configuration, the comparator pulls current from the capacitor to perform a decision. The configuration of the two sets of switches is alternated to toggle between the charging configuration and the decision configuration, allowing for the capacitor to be recharged between each decision performed by the comparator.

12 Claims, 7 Drawing Sheets

COMPARATOR WITH FLOATING CAPACITIVE SUPPLY

CROSS-REFERENCE TO RELATED APPLICATIONS

The present application claims the benefit of priority of U.S. Provisional Application No. 62/963,731 filed on Jan. 21, 2020, which is incorporated herein by reference in its entirety.

TECHNICAL FIELD

An embodiment of the present subject matter relates generally to comparators, and more specifically, to a comparator with floating capacitive supply.

BACKGROUND

In electronics, a comparator is a device that compares two input voltages or currents and outputs a digital signal indicating which input is larger. Comparators can be used to check whether an input has reached some predetermined value and can be used in a variety of applications, such as in analog to digital conversion, heat sensors, smoke alarms, heartbeat sensors, and the like. To perform a decision comparator, draw current from a power supply. Increasing the current to a comparator may increase the speed at which the comparator performs the decision. As multiple components in a circuit often share a common power supply, the current drawn by a comparator may negatively impact the other components in the circuit caused by crosstalk and/or increased noise. Accordingly, improvements are needed.

BRIEF DESCRIPTION OF THE DRAWINGS

Various ones of the appended drawings merely illustrate example embodiments of the present disclosure and cannot be considered as limiting its scope.

DETAILED DESCRIPTION

Figure 1:
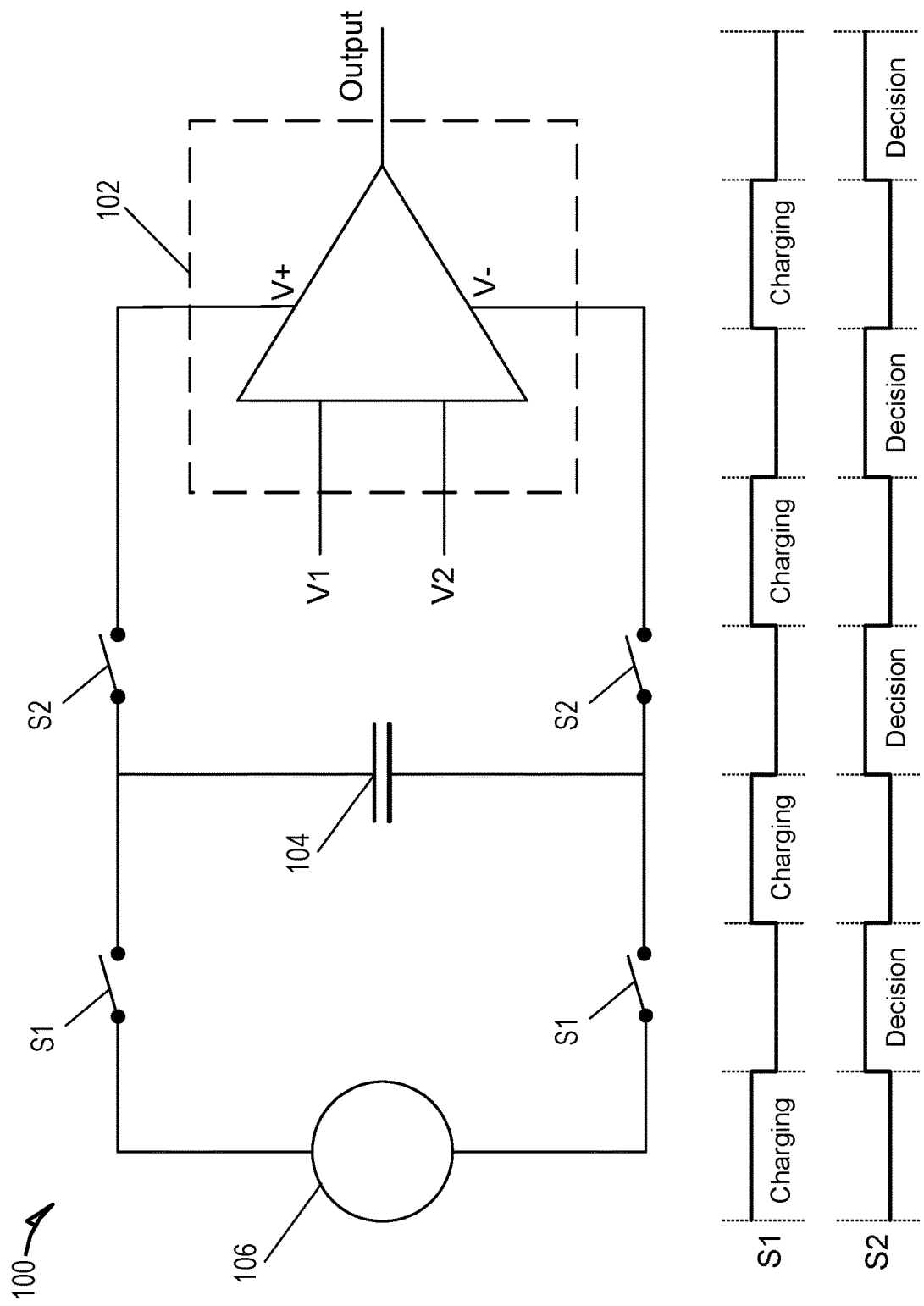
FIG. 1 is a diagram of a circuit including a comparator with a floating capacitive supply, according to certain example embodiments.

In the following description, for purposes of explanation, various details are set forth in order to provide a thorough understanding of some example embodiments. It will be apparent, however, to one skilled in the art, that the present subject matter may be practiced without these specific details, or with slight alterations.

Disclosed are circuits and methods for a comparator with a floating capacitive supply. Comparators are commonly used in electronics for a variety of applications. One common issue with using comparators is that the high current drawn from a power supply by a comparator to perform a decision causes a drop in the power supply, which in turn may result in crosstalk and/or increased noise that negatively impacts the other components in the circuit that share the common power supply with the comparator. To alleviate this issue, a comparator may be coupled to a capacitor that operates as a power supply for the comparator. Using a designated capacitor to provide current to the comparator provides the comparator with its own power supply, rather than the comparator sharing a power supply with other components. Accordingly, current drawn by the comparator from the capacitor while performing a decision does not affect the other components.

To implement a capacitor as an individualized power supply for a comparator, the capacitor is coupled between a comparator and a power supply. A set of electronic switches are coupled between the power supply and the capacitor and another set of electronic switches are coupled between the capacitor and the comparator. The two sets of electronic switches are configured in opposing operational states (e.g., open state and closed state) to shift the configuration of the circuit between a charging configuration and a decision configuration.

In the charging configuration, the set of the switches coupled between the capacitor and the power supply are configured into a closed state to allow current to flow from the power supply to the capacitor, thereby charging the capacitor. In contrast, the set of switches coupled between the capacitor and the comparator are configured into the open state to prevent current from flowing from the capacitor to the comparator.

In the decision configuration, the configuration of both sets of switches is changed. That is, the set of switches between the power supply and the capacitor is configured in the open state to prevent current from flowing from the power supply to the capacitor, while the set of switches between the capacitor and the comparator is configured in the closed state to allow current to flow from the capacitor to the comparator. This allows for the comparator to pull current from the capacitor to perform a decision without negatively affecting other components with crosstalk and/or noise.

The configuration of the two sets of switches is alternated to toggle between the charging configuration and the decision configuration. This allows for the capacitor to be recharged between each decision performed by the comparator. Further, the charging configuration may also allow the comparator to reset prior to each decision. For example, a latch comparator may reset while the two sets of switches is configured in the charging configuration.

Multiple comparators may be implemented with a corresponding capacitor used as an individualized power supply, which may reduce/eliminate crosstalk and/or noise associated with use of comparators. In some embodiments, multiple capacitor can be used as a power supply for a single comparator to provide additional current to the comparator. For example, two or more capacitors can be aligned in series to increase the overall size of the capacitors that provide current to the comparator, thereby increasing the amount of current provided to the comparator during a decision.

FIG. 1 is a diagram of a circuit 100 including a comparator 102 with a floating capacitive supply, according to certain example embodiments. To avoid obscuring the inventive subject matter with unnecessary detail, various functional components (e.g., modules, mechanisms, devices, nodes, etc.) that are not germane to conveying an understanding of the inventive subject matter have been omitted from FIG. 1. However, a skilled artisan will readily recognize that various additional functional components may be supported to facilitate additional functionality that is not specifically described herein.

The circuit 100 may be implemented in any of a variety of electronic devices. For example, the circuit 100 may be implemented in a device including some or all of the features, components, and peripherals of the machine 700 shown in FIG. 7.

As shown, the circuit 100 includes a power supply 106, a capacitor 104 and a comparator 102. The comparator 102 receives two input voltages (e.g., V1 and V2) and performs a decision indicating which of the two input voltages is larger. For example, the comparator 102 compares the two input voltages and provides an output signal (e.g., 1 or 0) indicating which of the two input signals is larger. The speed at which the comparator 102 performs a decision is based on the amount of current (e.g., positive supply voltage V+ and negative supply voltage V−) provided to the comparator 102. For example, providing additional current to the comparator 102 may increase the speed at which the comparator 102 performs the decision.

In current implementations, comparator 102 draw current directly from a shared power supply 106, which may negatively impact other components due to crosstalk and/or increased noise. To alleviate this issue, the comparator 102 shown in FIG. 1 utilizes the capacitor 104 as a power source to perform a decision. Using the capacitor 104 as a source of electrical current to the comparator 102 provides the comparator 106 with its own power source, rather than the comparator 106 drawing current from a power supply 106 that is shared with other components. Accordingly, current drawn by the comparator 102 from the capacitor 104 while performing a decision does not lead to crosstalk and/or increased noise negatively, which could negatively affect other components.

As shown, the capacitor 104 is coupled between the comparator 102 and the power supply 106. A first set of electronic switches S1 is coupled between the power supply 106 and the capacitor 104 and a second set of electronic switches S2 is coupled between the capacitor 104 and the comparator 102. The electronic switches may be any type of electronic switch that is capable of coupling and decoupling electronic components within a circuit 100. An electronic switch may be an electronic component configured into various operational states to disconnect or connect a conducting path in an electronic circuit to interrupt or divert electrical current from one conductor to another. For example, an electronic switch may be configured in an open state to interrupt electrical current along a conducting path. Alternately, an electronic switch may be configured in a closed state to allow electrical current to pass from one conductor to another along a conducting path.

The two sets of electronic switches S1, S2 are configured to operate in opposing operational states to shift the configuration of the circuit 100 between a charging configuration and a decision configuration. For example, when the first set of electronic switches S1 is in an open state, the second set of electronic switches S2 in in the closed state, and vice versa.

The charging configuration allows for the capacitor 104 to be charged by the power supply 106. For example, the first set of the switches S1 that are coupled between the capacitor 104 and the power supply 106 are configured into a closed state to allow current to flow from the power supply 106 to the capacitor 104, thereby charging the capacitor 104. The second set of electronic switches S2 coupled between the capacitor 104 and the comparator 102 are conversely configured into the open state to prevent current from flowing from the capacitor 104 to the comparator 102.

The decision configuration allows the comparator 102 to draw current from the capacitor 104 to perform a decision. In the decision configuration, the configuration of both the first set of electronic switches S1 and the second set of electronic switches S2 is changed. For example, the first set of electronic switches S1 that is coupled between the power supply 106 and the capacitor 104 is configured in the open state to prevent current from flowing from the power supply 106 to the capacitor 104, while the second set of electronic switches S2 that is coupled between the capacitor 104 and the comparator 102 is configured in the closed state to allow current to flow from the capacitor 104 to the comparator 102. This allows for the comparator 102 to pull current from the capacitor 104 to perform a decision without negatively affecting other components with crosstalk and/or noise.

The operational states of the first and second set of electronic switches S1, S2, may be repeatedly alternated to shift the configuration of the circuit 100 back and forth between the charging configuration and the decision configuration. This allows the capacitor 104 to recharge after each decision performed by the comparator 102. The operational states of the first and second set of electronic switches S1, S2 may be alternated according to any predetermined schedule, such as a timing schedule, and/or in response to a provided signal.

Figure 2:
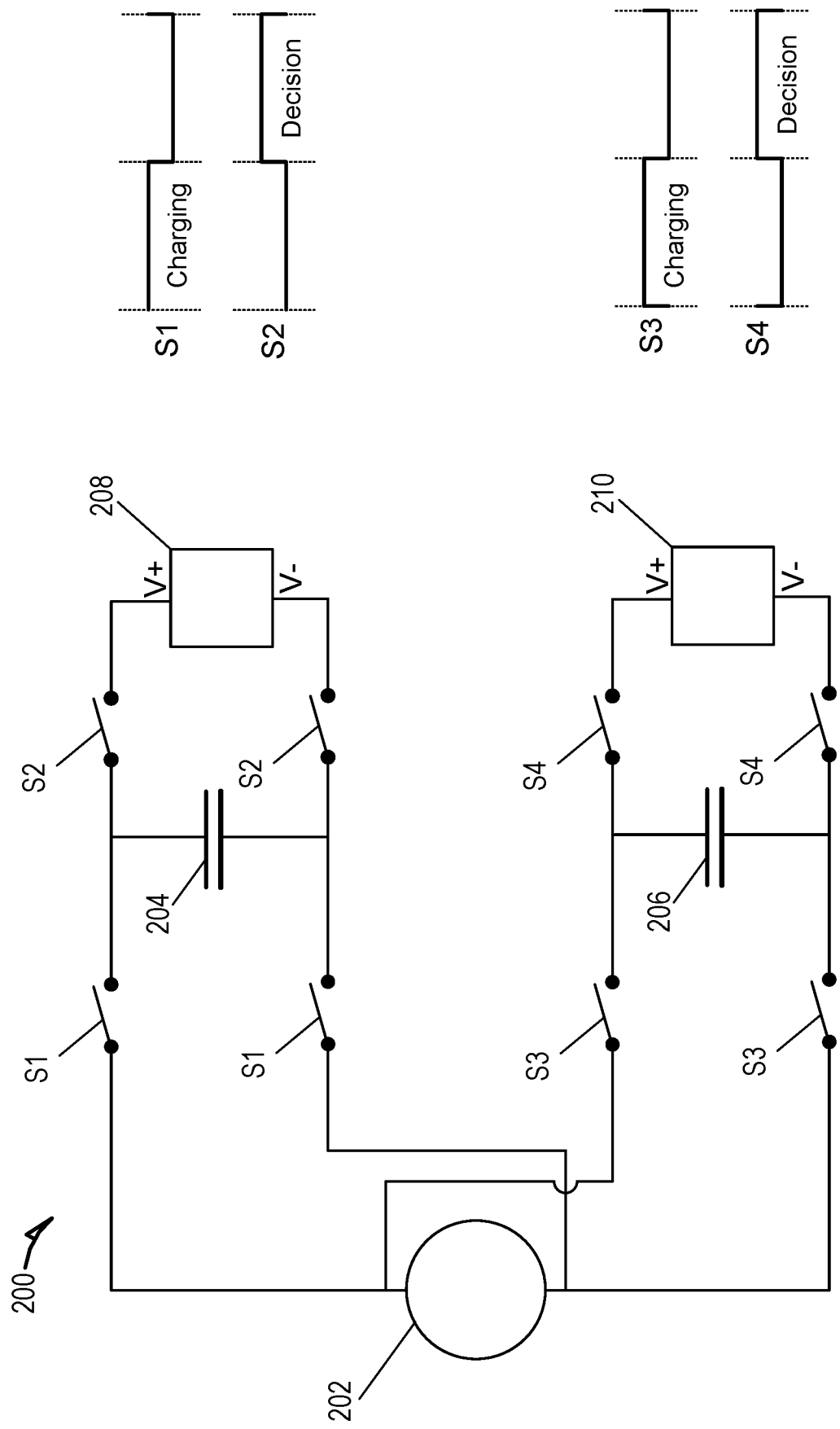
FIG. 2 is a diagram of a circuit including multiple comparators with individual floating capacitive supplies, according to certain example embodiments.

FIG. 2 is a diagram of a circuit 200 including multiple comparators 208, 210 with individual floating capacitive supplies, according to certain example embodiments. To avoid obscuring the inventive subject matter with unnecessary detail, various functional components (e.g., modules, mechanisms, devices, nodes, etc.) that are not germane to conveying an understanding of the inventive subject matter have been omitted from FIG. 2. However, a skilled artisan will readily recognize that various additional functional components may be supported to facilitate additional functionality that is not specifically described herein.

As shown, the circuit 200 includes two of the circuits 100 shown in FIG. 1. For example, the circuit 200 includes two comparators 208, 210, with each being coupled to its own capacitor 204, 206. Each of the capacitors 204, 206 operates as a power source for the respective comparator 208, 210 to with it is coupled. For example, the first comparator 208 shown at the top of FIG. 2 is coupled to a first capacitor 204, while the second comparator 210 shows at the bottom of FIG. 2 is coupled to the second capacitor 206. Accordingly, the first comparator 208 draws current from the first capacitor 204 to perform a decision, while the second comparator 210 draws current from the from the second capacitor 206 to perform a decision. Each of the capacitors 204, 206 is coupled to a shared power supply 202, which provides current to recharge both capacitors 204, 206.

Similar to the circuit 100 shown in FIG. 1, the circuit 200 shown in FIG. 2 includes multiple sets of electronic switches S1, S2, S3, S4 to shift between a charging configuration and a decision configuration. For example, a first set of electronic switches S1 is coupled between the power supply 202 and the first capacitor 204 and second set of electronic switches S2 is coupled between the first capacitor 204 and the first comparator 208.

The first set of electronic switches S1 and the second set of electronic switches S2 are configured to operate in opposing operational states to shift between a charging configuration and a decision configuration in relation to the first capacitor 204 and the second comparator 208. For example, when the first set of electronic switches S1 is in an open state, the second set of electronic switches S2 in in the closed state, and vice versa. The operational states of the first and second set of electronic switches S1, S2, is repeatedly alternated to shift between the charging configuration in which the first capacitor 204 draws current from the power supply 202 and the decision configuration in which the first capacitor 204 provides current to the first comparator 208 to perform a decision.

Similarly, a third set of switches S3 is coupled between the power supply 202 and the second capacitor 206 and a fourth set of switches S4 is coupled between the second capacitor 206 and the second comparator 210. The third set of switches S3 and the fourth set of switches S4 are also configured to operate in opposing operational states to shift between a charging configuration and a decision configuration in relation to the second capacitor 206 and the second comparator 210. For example, when the third set of electronic switches S3 is in an open state, the fourth set of electronic switches S4 in in the closed state, and vice versa. The operational states of the third and fourth set of electronic switches S3, S4, is repeatedly alternated to shift between the charging configuration in which the second capacitor 206 draws current from the power supply 202, and the decision configuration in which the second capacitor 206 provides current to the second comparator 210 to perform a decision.

The configuration of the first set of electronic switches S1 and second set of electronic switches S2 may be alternated according to the same or different schedule as the third set of switches S3 and the fourth set of switches S4. Further, although the circuit 200 shows only two comparators 208, 210 with corresponding capacitors 204, 206, this is just one example and is not meant to be limiting. Any number of comparators 208, 210 with corresponding capacitors 204, 206 can be arranged as shown in FIGS. 1 and 2. Further, any of a variety of types of capacitors 204, 206 and comparators 208, 210 may be used. For example, the comparators 208, 210 may be a latch comparator.

Figure 3:
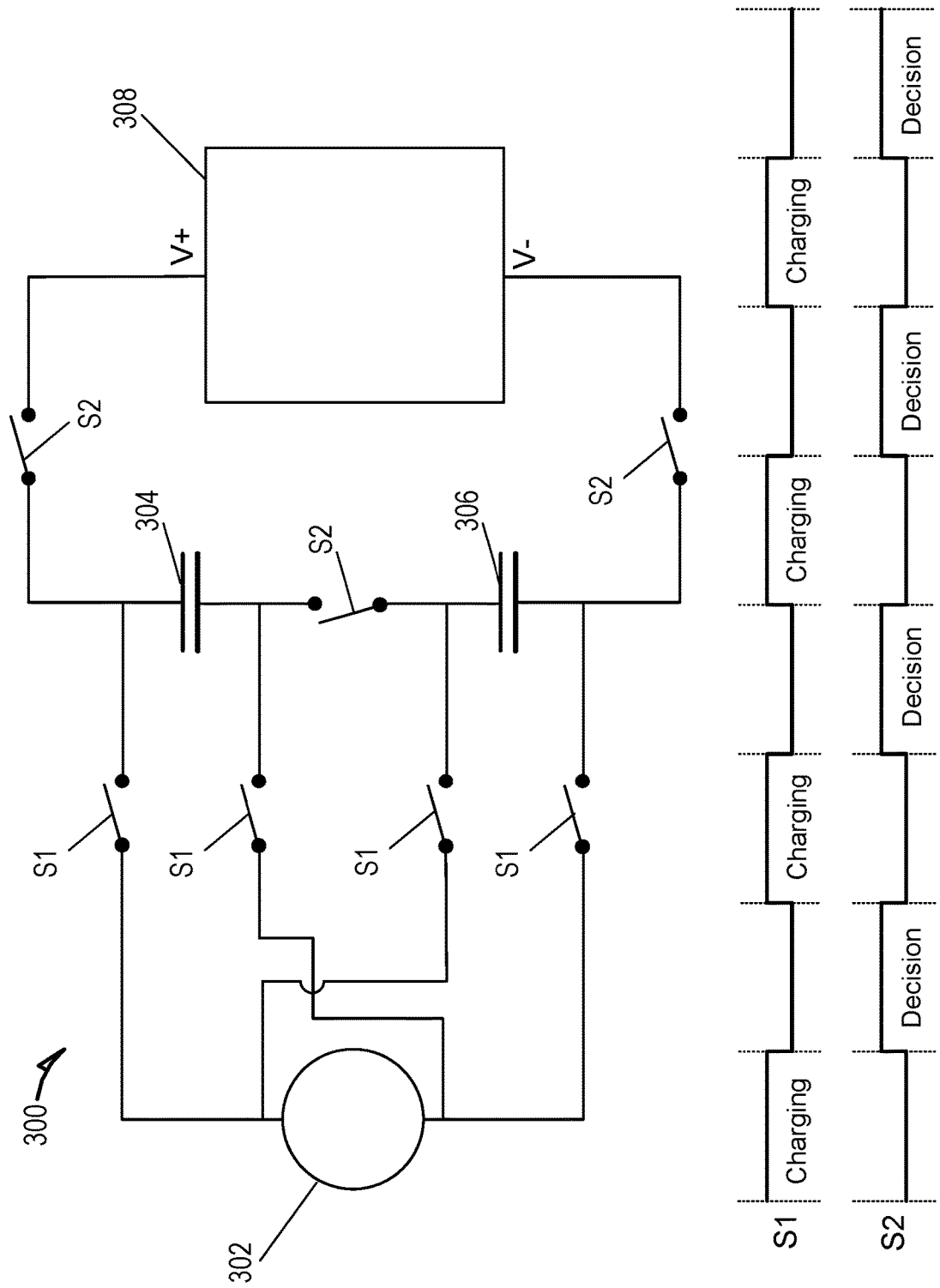
FIG. 3 is a diagram of a circuit including a comparator with multiple floating capacitive supplies arranged in series, according to some example embodiments.

FIG. 3 is a diagram of a circuit 300 including a comparator 308 with multiple floating capacitive supplies arranged in series, according to some example embodiments. To avoid obscuring the inventive subject matter with unnecessary detail, various functional components (e.g., modules, mechanisms, devices, nodes, etc.) that are not germane to conveying an understanding of the inventive subject matter have been omitted from FIG. 3. However, a skilled artisan will readily recognize that various additional functional components may be supported to facilitate additional functionality that is not specifically described herein.

As shown, the comparator 308 is coupled to two capacitors 304, 306 that are arranged in series. The two capacitors 304, 306 are also coupled to a power supply 302. The circuit 300 includes a first set of electronic switches S1 coupled between the power supply 302 and the two capacitors 304, 306, and a second set of electronic switches S2 coupled between the two capacitors 304, 306 and the comparator 308.

The two sets of electronic switches S1, S2 are configured to operate in opposing operational states to shift the configuration of the circuit 300 between a charging configuration and a decision configuration. For example, when the first set of electronic switches S1 is in an open state, the second set of electronic switches S2 in in the closed state, and vice versa.

The charging configuration allows for the two capacitors 304, 306 to be charged by the power supply 302. For example, the first set of the switches S1 that are coupled between the two capacitors 304, 306 and the power supply 302 are configured into a closed state to allow current to flow from the power supply 302 to the two capacitors 304, 306, thereby charging the two capacitors 304, 306. The second set of electronic switches S2 coupled between the two capacitors 304, 306 and the comparator 308, however, are configured into the open state to prevent current from flowing from the two capacitors 304, 306 to the comparator 308.

The decision configuration allows the comparator 308 to draw current from the two capacitors 304, 306 to perform a decision. In the decision configuration, the configuration of both the first set of electronic switches S1 and the second set of electronic switches S2 is changed. For example, the first set of electronic switches S1 is configured in the open state to prevent current from flowing from the power supply 302 to the two capacitors 304, 306, while the second set of electronic switches S2 that is coupled between the two capacitors 304, 306 and the comparator 308 are configured in the closed state to allow current to flow from the two capacitors 304, 306 to the comparator 308. This allows for the comparator 308 to pull current from the two capacitors 304, 306 to perform a decision without negatively affecting other components with crosstalk and/or noise.

Use of multiple capacitors 304, 306 arranged in series provides for increased current to be provided to the comparator 308. Additional current may increase the speed at which the comparator 308 performs a decision. Although the circuit 300 includes only two capacitors 304, 306, this is just one example and is not meant to be limiting. Any number of capacitors 304, 306 arranged in series may be used to power a single comparator 308.

Figure 4:
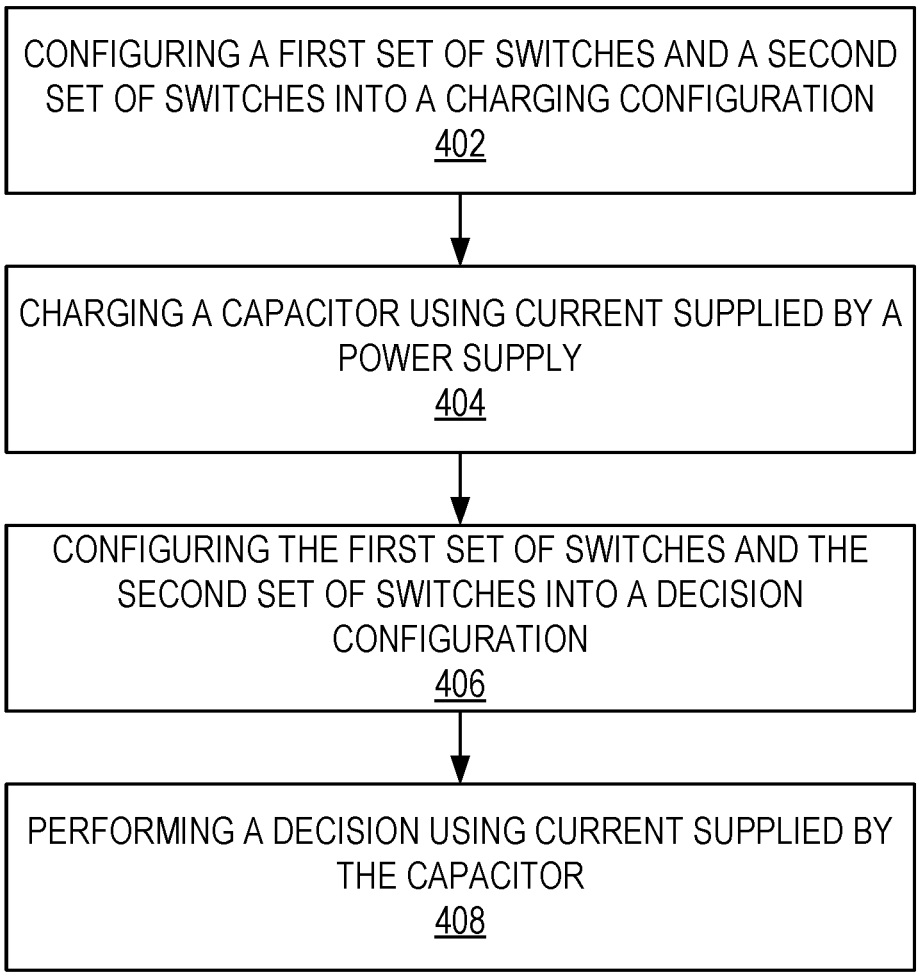
FIG. 4 is a flowchart showing a method for using a comparator with a floating capacitive supply, according to some example embodiments.

FIG. 4 is a flowchart showing a method 400 for using a comparator with a floating capacitive supply, according to some example embodiments. The method 400 is described below by way of example with reference to the circuit 100 shown in FIG. 1, however, it shall be appreciated that at least some of the operations of the method 400 may be deployed on various other hardware and/or software configurations and the method 400 is not intended to be limited to the circuit 100 shown in FIG. 1.

At operation 402, a first set of electronic switches S1 and a second set of electronic switches S2 are configured into a charging configuration. The first set of electronic switches S1 is coupled between a power supply 106 and a capacitor 104 and the second set of electronic switches S2 is coupled between the capacitor 104 and a comparator 102. The charging configuration allows for the capacitor 104 to be charged by the power supply 106. For example, the first set of the switches S1 that are coupled between the capacitor 104 and the power supply 106 are configured into a closed state to allow current to flow from the power supply 106 to the capacitor 104, thereby charging the capacitor 104. The second set of electronic switches S2 coupled between the capacitor 104 and the comparator 102 are conversely configured into the open state to prevent current from flowing from the capacitor 104 to the comparator 102.

At operation 404, the capacitor 104 is charged using current supplied by the power supply 106. For example, the capacitor 104 draws current from the power supply 106 to initially charge the capacitor 104 or replenish current expended by the capacitor 104 to the comparator 102 during a previous decision.

At operation 406, the first set of electronic switches S1 and a second set of electronic switches S2 are configured into a decision configuration. The decision configuration allows the comparator 102 to draw current from the capacitor 104 to perform a decision. In the decision configuration, the configuration of both the first set of electronic switches S1 and the second set of electronic switches S2 is changed. For example, the first set of electronic switches S1 that is coupled between the power supply 106 and the capacitor 104 is configured in the open state to prevent current from flowing from the power supply 106 to the capacitor 104, while the second set of electronic switches S2 that is coupled between the capacitor 104 and the comparator 102 is configured in the closed state to allow current to flow from the capacitor 104 to the comparator 102.

At operation 408, the comparator 102 performs a decision using current supplied by the capacitor 104. For example, the comparator 102 pulls current from the capacitor 104 to perform the decision. As the comparator 102 is not coupled to the power supply 106 while performing the decision, the other components connected to the power supply 106 are not negatively affected with crosstalk and/or noise caused by the decision.

The method 400 may be repeated to alternate the operational states of the first and second set of electronic switches S1, S2 back and forth between the charging configuration and the decision configuration. This allows the capacitor 104 to recharge after each decision performed by the comparator 102.

Figure 5:
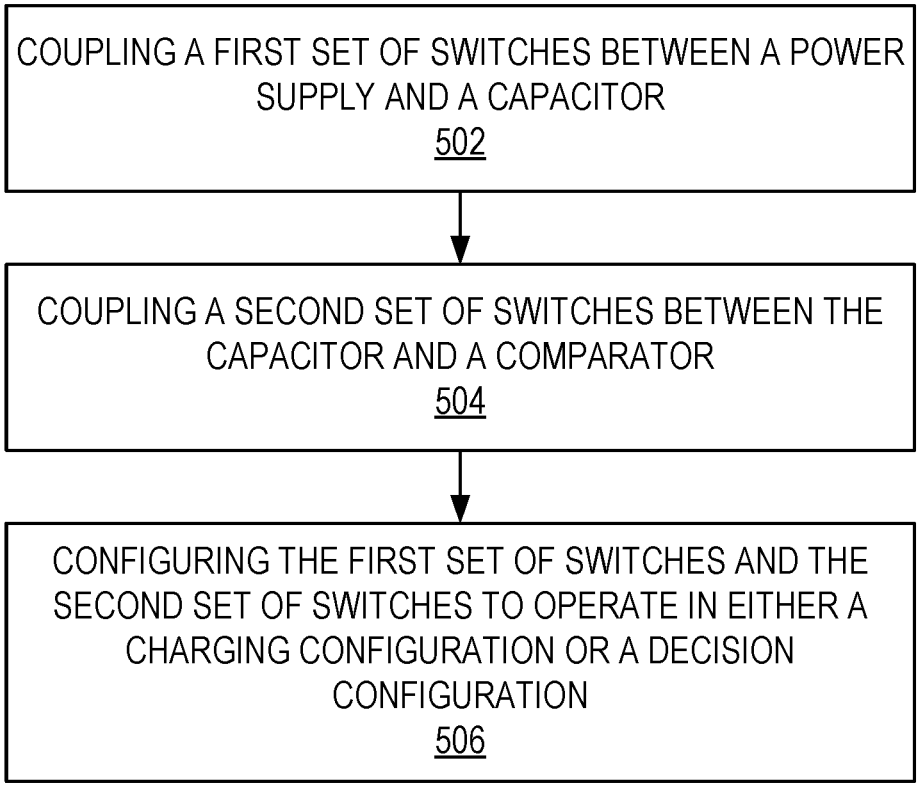
FIG. 5 is a flowchart showing a method for manufacturing a comparator with a floating capacitive supply, according to some example embodiments.

FIG. 5 is a flowchart showing a method 500 for manufacturing a comparator with a floating capacitive supply, according to some example embodiments. The method 500 is described below by way of example with reference to the circuit 100 shown in FIG. 1, however, it shall be appreciated that at least some of the operations of the method 500 may be deployed on various other hardware and/or software configurations and the method 500 is not intended to be limited to the circuit 100 shown in FIG. 1.

At operation 502, a first set of electronic switches S1 is coupled between a power supply 106 and a capacitor 104.

At operation 504, a second set of electronic switches S2 is coupled between the capacitor 104 and a comparator 102.

At operation 506, the first set of electronic switches S1 and the second set of electronic switches S2 is configured to operation in either a charging configuration or a decision configuration. For example, the two sets of electronic switches S1, S2 are configured to operate in opposing operational states to shift the configuration of a circuit 100 between the charging configuration and the decision configuration. For example, when the first set of electronic switches S1 is in an open state, the second set of electronic switches S2 in in the closed state, and vice versa.

The charging configuration allows for the capacitor 104 to be charged by the power supply 106. For example, the first set of the switches S1 that are coupled between the capacitor 104 and the power supply 106 are configured into a closed state to allow current to flow from the power supply 106 to the capacitor 104, thereby charging the capacitor 104. The second set of switches S1 coupled between the capacitor 104 and the comparator 102 are conversely configured into the open state to prevent current from flowing from the capacitor 104 to the comparator 102.

The decision configuration allows the comparator 102 to draw current from the capacitor 104 to perform a decision. In the decision configuration, the configuration of both the first set of switches S1 and the second set of switches S2 is changed. For example, the first set of switches S1 that is coupled between the power supply 106 and the capacitor 104 is configured in the open state to prevent current from flowing from the power supply 106 to the capacitor 104, while the second set of switches S2 that is coupled between the capacitor 104 and the comparator 102 is configured in the closed state to allow current to flow from the capacitor 104 to the comparator 102. This allows for the comparator 102 to pull current from the capacitor 104 to perform a decision without negatively affecting other components with crosstalk and/or noise.

The method 500 may be repeated to implement any number of comparators 102 with a capacitor 104 as a power source. Further, the capacitors 104 may be coupled to a common power supply 106.

Software Architecture

Figure 6:
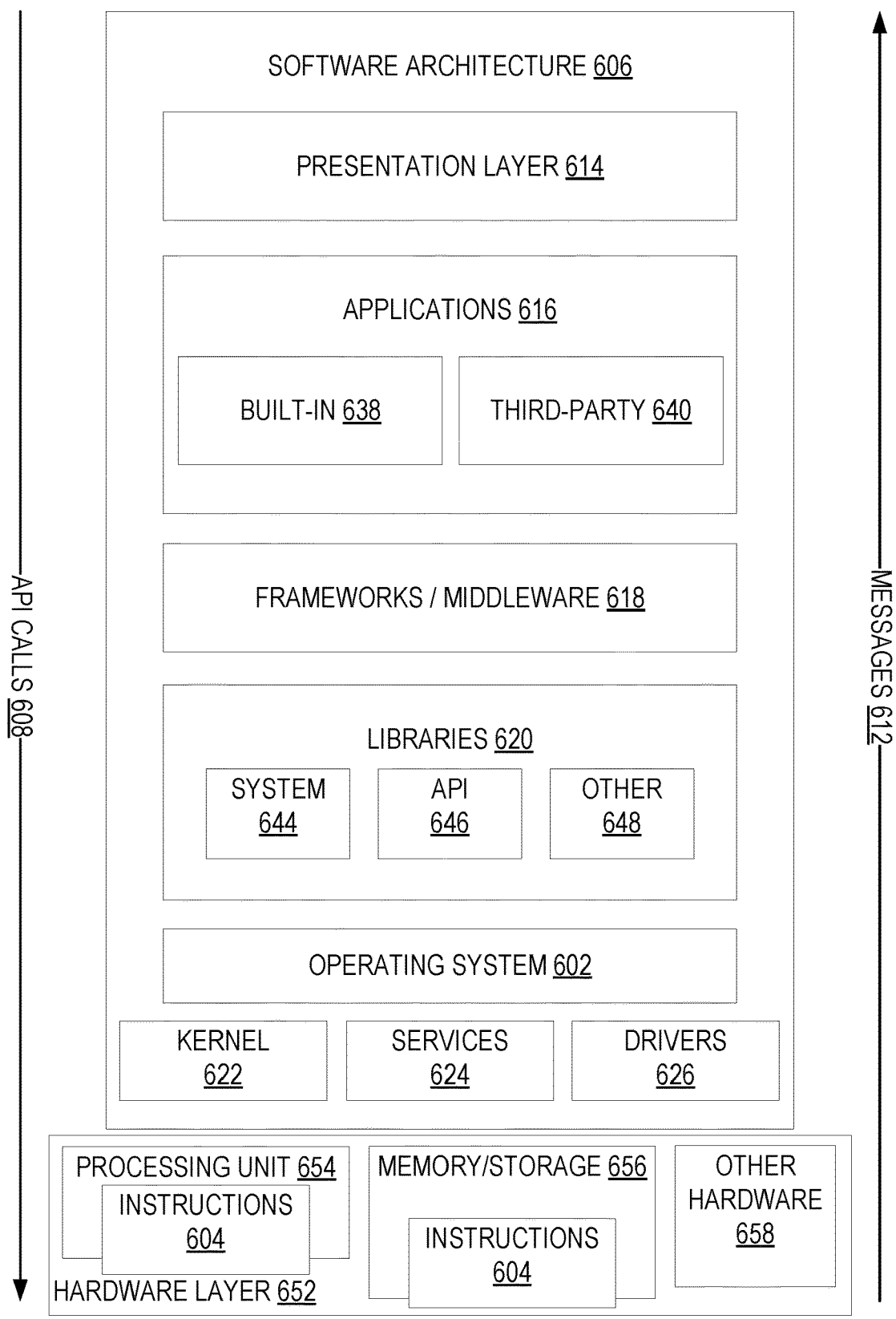
FIG. 6 is a block diagram illustrating an example software architecture, which may be used in conjunction with various hardware architectures herein described.

FIG. 6 is a block diagram illustrating an example software architecture 606, which may be used in conjunction with various hardware architectures herein described. FIG. 6 is a non-limiting example of a software architecture 606 and it will be appreciated that many other architectures may be implemented to facilitate the functionality described herein. The software architecture 606 may execute on hardware such as machine 700 of FIG. 7 that includes, among other things, processors 704, memory 714, and (input/output) I/O components 718. A representative hardware layer 652 is illustrated and can represent, for example, the machine 700 of FIG. 7. The representative hardware layer 652 includes a processing unit 654 having associated executable instructions 604. Executable instructions 604 represent the executable instructions of the software architecture 606, including implementation of the methods, components, and so forth described herein. The hardware layer 652 also includes memory and/or storage modules 656, which also have executable instructions 604. The hardware layer 652 may also comprise other hardware 658.

In the example architecture of FIG. 6, the software architecture 606 may be conceptualized as a stack of layers where each layer provides particular functionality, such as the Open Systems Interconnection model (OSI model). For example, the software architecture 606 may include layers such as an operating system 602, libraries 620, frameworks/middleware 618, applications 616, and a presentation layer 614. Operationally, the applications 616 and/or other components within the layers may invoke application programming interface (API) calls 608 through the software stack and receive a response such as messages 612 in response to the API calls 608. The layers illustrated are representative in nature and not all software architectures have all layers. For example, some mobile or special purpose operating systems may not provide a frameworks/middleware 618, while others may provide such a layer. Other software architectures may include additional or different layers.

The operating system 602 may manage hardware resources and provide common services. The operating system 602 may include, for example, a kernel 622, services 624, and drivers 626. The kernel 622 may act as an abstraction layer between the hardware and the other software layers. For example, the kernel 622 may be responsible for memory management, processor management (e.g., scheduling), component management, networking, security settings, and so on. The services 624 may provide other common services for the other software layers. The drivers 626 are responsible for controlling or interfacing with the underlying hardware. For instance, the drivers 626 include display drivers, camera drivers, Bluetooth® drivers, flash memory drivers, serial communication drivers (e.g., Universal Serial Bus (USB) drivers), Wi-Fi® drivers, audio drivers, power management drivers, and so forth, depending on the hardware configuration.

The libraries 620 provide a common infrastructure that is used by the applications 616 and/or other components and/or layers. The libraries 620 provide functionality that allows other software components to perform tasks in an easier fashion than to interface directly with the underlying operating system 602 functionality (e.g., kernel 622, services 624, and/or drivers 626). The libraries 620 may include system libraries 644 (e.g., C standard library) that may provide functions such as memory allocation functions, string manipulation functions, mathematical functions, and the like. In addition, the libraries 620 may include API libraries 646 such as media libraries (e.g., libraries to support presentation and manipulation of various media format such as MPEG4, H.264, MP3, AAC, AMR, JPG, PNG), graphics libraries (e.g., an OpenGL framework that may be used to render 2D and 3D in a graphic content on a display), database libraries (e.g., SQLite that may provide various relational database functions), web libraries (e.g., WebKit that may provide web browsing functionality), and the like. The libraries 620 may also include a wide variety of other libraries 648 to provide many other APIs to the applications 616 and other software components/modules.

The frameworks/middleware 618 (also sometimes referred to as middleware) provide a higher-level common infrastructure that may be used by the applications 616 and/or other software components/modules. For example, the frameworks/middleware 618 may provide various graphical user interface (GUI) functions, high-level resource management, high-level location services, and so forth. The frameworks/middleware 618 may provide a broad spectrum of other APIs that may be used by the applications 616 and/or other software components/modules, some of which may be specific to a particular operating system 602 or platform.

The applications 616 include built-in applications 638 and/or third-party applications 640. Examples of representative built-in applications 638 may include, but are not limited to, a contacts application, a browser application, a book reader application, a location application, a media application, a messaging application, and/or a game application. Third-party applications 640 may include an application developed using the ANDROID™ or IOS™ software development kit (SDK) by an entity other than the vendor of the particular platform, and may be mobile software running on a mobile operating system such as IOS™, ANDROID™, WINDOWS® Phone, or other mobile operating systems. The third-party applications 640 may invoke the API calls 608 provided by the mobile operating system (such as operating system 602) to facilitate functionality described herein.

The applications 616 may use built in operating system functions (e.g., kernel 622, services 624, and/or drivers 626), libraries 620, and frameworks/middleware 618 to create UIs to interact with users of the system. Alternatively, or additionally, in some systems, interactions with a user may occur through a presentation layer, such as presentation layer 614. In these systems, the application/component "logic" can be separated from the aspects of the application/component that interact with a user.

Figure 7:
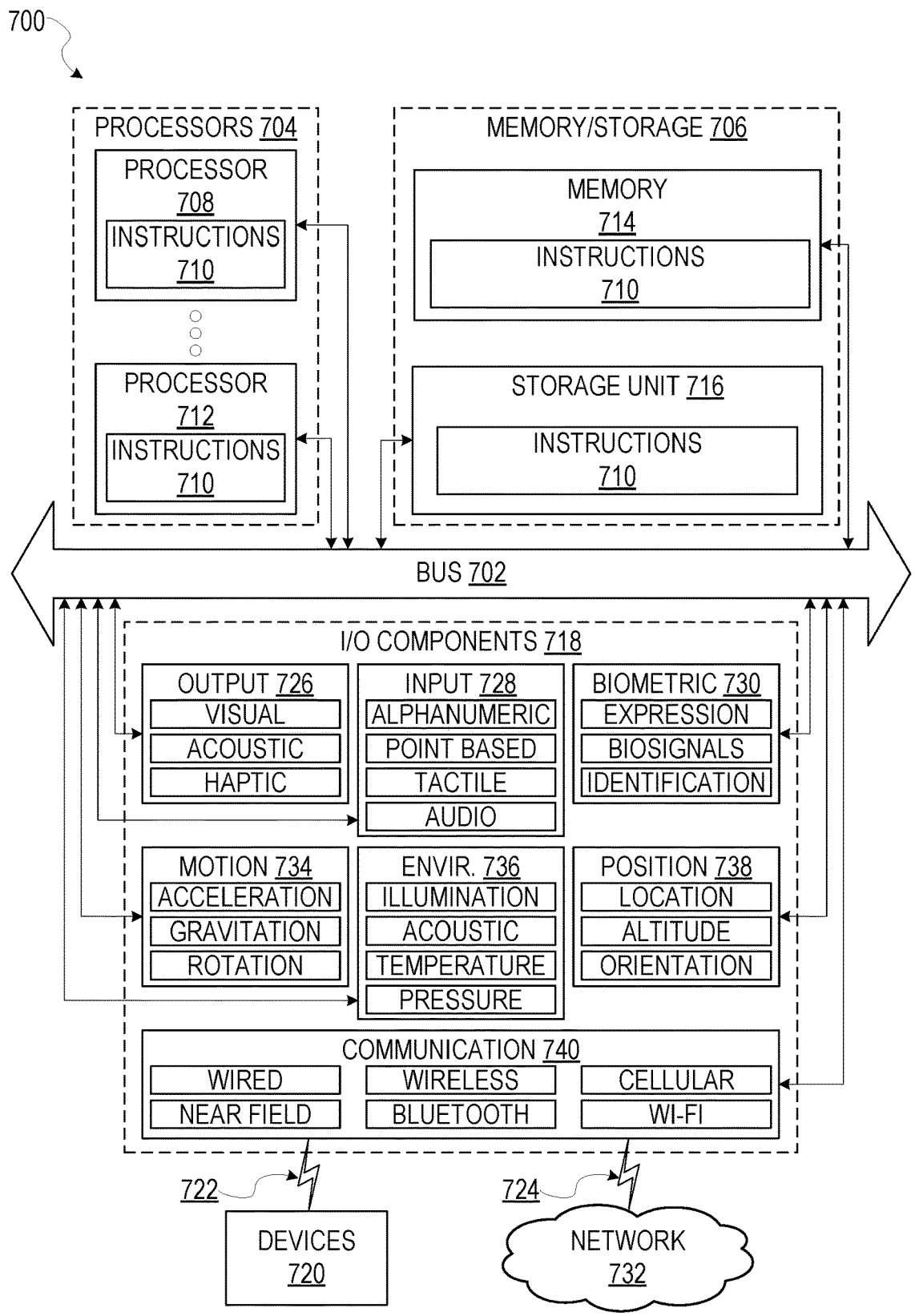
FIG. 7 is a block diagram illustrating components of a machine, according to some example embodiments, able to read instructions from a machine-readable medium (e.g., a machine-readable storage medium) and perform any one or more of the methodologies discussed herein.

FIG. 7 is a block diagram illustrating components of a machine 700, according to some example embodiments, able to read instructions 604 from a machine-readable medium (e.g., a machine-readable storage medium) and perform any one or more of the methodologies discussed herein. Specifically, FIG. 7 shows a diagrammatic representation of the machine 700 in the example form of a computer system, within which instructions 710 (e.g., software, a program, an application, an applet, an app, or other executable code) for causing the machine 700 to perform any one or more of the methodologies discussed herein may be executed. As such, the instructions 710 may be used to implement modules or components described herein. The instructions 710 transform the general, non-programmed machine 700 into a particular machine 700 programmed to carry out the described and illustrated functions in the manner described. In alternative embodiments, the machine 700 operates as a standalone device or may be coupled (e.g., networked) to other machines. In a networked deployment, the machine 700 may operate in the capacity of a server machine or a client machine in a server-client network environment, or as a peer machine in a peer-to-peer (or distributed) network environment. The machine 700 may comprise, but not be limited to, a server computer, a client computer, a PC, a tablet computer, a laptop computer, a netbook, a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine 700 capable of executing the instructions 710, sequentially or otherwise, that specify actions to be taken by machine 700. Further, while only a single machine 700 is illustrated, the term "machine" shall also be taken to include a collection of machines that individually or jointly execute the instructions 710 to perform any one or more of the methodologies discussed herein.

The machine 700 may include processors 704, memory/storage 706, and I/O components 718, which may be configured to communicate with each other such as via a bus 702. The memory/storage 706 may include a memory 714, such as a main memory, or other memory storage, and a storage unit 716, both accessible to the processors 704 such as via the bus 702. The storage unit 716 and memory 714 store the instructions 710 embodying any one or more of the methodologies or functions described herein. The instructions 710 may also reside, completely or partially, within the memory 714, within the storage unit 716, within at least one of the processors 704 (e.g., within the processor's cache memory), or any suitable combination thereof, during execution thereof by the machine 700. Accordingly, the memory 714, the storage unit 716, and the memory of processors 704 are examples of machine-readable media.

The I/O components 718 may include a wide variety of components to receive input, provide output, produce output, transmit information, exchange information, capture measurements, and so on. The specific I/O components 718 that are included in a particular machine 700 will depend on the type of machine. For example, portable machines such as mobile phones will likely include a touch input device or other such input mechanisms, while a headless server machine will likely not include such a touch input device. It will be appreciated that the I/O components 718 may include many other components that are not shown in FIG. 7. The I/O components 718 are grouped according to functionality merely for simplifying the following discussion and the grouping is in no way limiting. In various example embodiments, the I/O components 718 may include output components 726 and input components 728. The output components 726 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 728 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like.

In further example embodiments, the I/O components 718 may include biometric components 730, motion components 734, environmental components 736, or position components 738 among a wide array of other components. For example, the biometric components 730 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 734 may include acceleration sensor components (e.g., accelerometer), gravitation sensor components, rotation sensor components (e.g., gyroscope), and so forth. The environmental components 736 may include, for example, illumination sensor components (e.g., photometer), temperature sensor components (e.g., one or more thermometer that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detect concentrations of hazardous gases for safety or to measure pollutants in the atmosphere), or other components that may provide indications, measurements, or signals corresponding to a surrounding physical environment. The position components 738 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 718 may include communication components 740 operable to couple the machine 700 to a network 732 or devices 720 via coupling 724 and coupling 722, respectively. For example, the communication components 740 may include a network interface component or other suitable device to interface with the network 732. In further examples, communication components 740 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 720 may be another machine or any of a wide variety of peripheral devices (e.g., a peripheral device coupled via a USB).

Moreover, the communication components 740 may detect identifiers or include components operable to detect identifiers. For example, the communication components 740 may include radio frequency identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 740 such as location via Internet Protocol (IP) geo-location, location via Wi-Fi® signal triangulation, location via detecting a NFC beacon signal that may indicate a particular location, and so forth.

Glossary

"CARRIER SIGNAL" in this context refers to any intangible medium that is capable of storing, encoding, or carrying instructions 710 for execution by the machine 700, and includes digital or analog communications signals or other intangible medium to facilitate communication of such instructions 710. Instructions 710 may be transmitted or received over the network 732 using a transmission medium via a network interface device and using any one of a number of well-known transfer protocols.

"CLIENT DEVICE" in this context refers to any machine 700 that interfaces to a communications network 732 to obtain resources from one or more server systems or other client devices. A client device may be, but is not limited to, mobile phones, desktop computers, laptops, PDAs, smart phones, tablets, ultra books, netbooks, laptops, multi-processor systems, microprocessor-based or programmable consumer electronics, game consoles, STBs, or any other communication device that a user may use to access a network 732.

"COMMUNICATIONS NETWORK" in this context refers to one or more portions of a network 732 that may be an ad hoc network, an intranet, an extranet, a virtual private network (VPN), a LAN, a wireless LAN (WLAN), a WAN, a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network 732 or a portion of a network 732 may include a wireless or cellular network and the coupling may be a Code Division Multiple Access (CDMA) connection, a Global System for Mobile communications (GSM) connection, or other type of cellular or wireless coupling. In this example, the coupling may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard setting organizations, other long range protocols, or other data transfer technology.

"MACHINE-READABLE MEDIUM" in this context refers to a component, device or other tangible media able to store instructions 710 and data temporarily or permanently and may include, but is not be limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store instructions 710. The term "machine-readable medium" shall also be taken to include any medium, or combination of multiple media, that is capable of storing instructions 710 (e.g., code) for execution by a machine 700, such that the instructions 710, when executed by one or more processors 704 of the machine 700, cause the machine 700 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

"COMPONENT" in this context refers to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various example embodiments, one or more computer systems (e.g., a standalone computer system, a client computer system, or a server computer system) or one or more hardware components of a computer system (e.g., a processor or a group of processors 704) may be configured by software (e.g., an application 616 or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application specific integrated circuit (ASIC). A hardware component may also include programmable logic or circuitry that is temporarily configured by software to perform certain operations. For example, a hardware component may include software executed by a general-purpose processor 704 or other programmable processor 704. Once configured by such software, hardware components become specific machines 700 (or specific components of a machine 700) uniquely tailored to perform the configured functions and are no longer general-purpose processors 704. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose processor 704 configured by software to become a special-purpose processor, the general-purpose processor 704 may be configured as respectively different special-purpose processors (e.g., comprising different hardware components) at different times. Software accordingly configures a particular processor or processors 704, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses 702) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors 704 that are temporarily configured (e.g., by software) or permanently configured to perform the relevant operations. Whether temporarily or permanently configured, such processors 704 may constitute processor-implemented components that operate to perform one or more operations or functions described herein. As used herein, "processor-implemented component" refers to a hardware component implemented using one or more processors 704. Similarly, the methods described herein may be at least partially processor-implemented, with a particular processor or processors 704 being an example of hardware. For example, at least some of the operations of a method may be performed by one or more processors 704 or processor-implemented components. Moreover, the one or more processors 704 may also operate to support performance of the relevant operations in a "cloud computing" environment or as a "software as a service" (SaaS). For example, at least some of the operations may be performed by a group of computers (as examples of machines 700 including processors 704), with these operations being accessible via a network 732 (e.g., the Internet) and via one or more appropriate interfaces (e.g., an API). The performance of certain of the operations may be distributed among the processors 704, not only residing within a single machine 700, but deployed across a number of machines 700. In some example embodiments, the processors 704 or processor-implemented components may be located in a single geographic location (e.g., within a home environment, an office environment, or a server farm). In other example embodiments, the processors 704 or processor-implemented components may be distributed across a number of geographic locations.

"PROCESSOR" in this context refers to any circuit or virtual circuit (a physical circuit emulated by logic executing on an actual processor 704) that manipulates data values according to control signals (e.g., "commands," "op codes," "machine code," etc.) and which produces corresponding output signals that are applied to operate a machine 700. A processor 704 may be, for example, a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC) or any combination thereof. A processor 704 may further be a multi-core processor having two or more independent processors 704 (sometimes referred to as "cores") that may execute instructions 710 contemporaneously.

What is claimed is:

1. A circuit comprising:
   a power supply;
   a first capacitor;
   a first latching comparator including a first free input, a second free input and, a free output;
   a first set of switches coupled between the power supply and the first capacitor; and
   a second set of switches coupled between the first capacitor and the first latching comparator, the first set of switches and the second set of switches being configurable into either a charging configuration or a decision configuration, wherein:
      in the charging configuration the first set of switches is in a closed state to allow current to flow from the power supply to the first capacitor, and the second set of switches is in an open state to prevent current from flowing from the first capacitor to the first latching comparator, the charging configuration further causing the first latching comparator to reset, and
      in the decision configuration the first set of switches is in the open state to prevent current from flowing from the power supply to the first capacitor, and the second set of switches in in the closed state to allow current to flow from the first capacitor to the first latching comparator to power the first latching comparator to perform a comparison of a first input received via the first free input to a second input received via the second free input and provide an output based on the comparison via the free output.

2. The circuit of claim 1, further comprising:
   a second capacitor;
   a second comparator;
   a third set of switches coupled between the power supply and the second capacitor; and
   a fourth set of switches coupled between the second capacitor and the second comparator, the third set of switches and the fourth set of switches being configurable into the charging configuration and the decision configuration, wherein:
      in the charging configuration the third set of switches are in the closed state to allow current to flow from the power supply to the second capacitor, and the fourth set of switches is in the open state to prevent current from flowing from the second capacitor to the second comparator, and
      in the decision configuration the third set of switches is in the open state to prevent current from flowing from the power supply to the second capacitor, and the fourth set of switches is in the closed state to allow current to flow from the second capacitor to the second comparator.

3. The circuit of claim 1, wherein the first latching comparator receives an input signal while the first set of switches and the second set of switches are configured into the decision configuration.

4. The circuit of claim 1, further comprising:
   a second capacitor coupled in series with the first capacitor between the first set of switches and the second set of switches, wherein the charging configuration allows current to flow from the power supply to the first capacitor and the second capacitor and prevents current from flowing from the first capacitor and the second capacitor to the first latching comparator, and
   the decision configuration prevents current from flowing from the power supply to the first capacitor and the second capacitor and allows current to flow from the first capacitor and the second capacitor to the first latching comparator.

5. The circuit of claim 1, wherein the first set of switches and the second set of switches are configured between the charging configuration and the decision configuration based on a predetermined timing sequence.

6. A method comprising:
   configuring a first set of switches and a second set of switches into a charging configuration, the first set of switches being coupled between a power supply and a first capacitor and the second set of switches being coupled between the first capacitor and a first latching comparator, the first latching comparator including a first free input, a second free input and, a free output, wherein configuring the first set of switches and the second set of switches into the charging configuration comprises:
      configuring the first set of switches into a closed state to allow current to flow from the power supply to the first capacitor, and
      configuring the second set of switches into an open state to prevent current from flowing from the first capacitor to the first latching comparator, the charging configuration further causing the first latching comparator to reset; and
   configuring the first set of switches and the second set of switches into a decision configuration, wherein configuring the first set of switches and the second set of switches into the decision configuration comprises:
      configuring the first set of switches into the open state to prevent current from flowing from the power supply to the first capacitor, and configuring the second set of switches into the closed state to allow current to flow from the first capacitor to the first latching comparator to power the first latching comparator to perform a comparison of a first input received via the first free input to a second input received via the second free input and provide an output based on the comparison via the free output.

7. The method of claim 6, further comprising:
configuring a third set of switches and a fourth set of switches into the charging configuration, the third set of switches being coupled between the power supply and a second capacitor and the fourth set of switches being coupled between the second capacitor and a second comparator, wherein configuring the third set of switches and the fourth set of switches into the charging configuration comprises:
- configuring the third set of switches into the closed state to allow current to flow from the power supply to the second capacitor, and
- configuring the fourth set of switches into the open state to prevent current from flowing from the second capacitor to the second comparator; and configuring the third set of switches and the fourth set of switches into the decision configuration, wherein configuring the third set of switches and the fourth set of switches into the decision configuration comprises:
- configuring the third set of switches into the open state to prevent current from flowing from the power supply to the second capacitor, and
- configuring the fourth set of switches into the closed state to allow current to flow from the second capacitor to the second comparator.

8. The method of claim 6, wherein the first latching comparator receives an input signal while the first set of switches and the second set of switches are configured into the decision configuration.

9. The method of claim 6, wherein a second capacitor is coupled in series with the first capacitor between the first set of switches and the second set of switches such that the charging configuration allows current to flow from the power supply to the first capacitor and the second capacitor and prevents current from flowing from the first capacitor and the second capacitor to the first latching comparator, and the decision configuration prevents current from flowing from the power supply to the first capacitor and the second capacitor and allows current to flow from the first capacitor and the second capacitor to the first latching comparator.

10. The method of claim 6, wherein the first set of switches and the second set of switches are configured between the charging configuration and the decision configuration based on a predetermined timing sequence.

11. A method comprising:
coupling a first set of switches to a power supply and a first capacitor;
coupling a second set of switches to the first capacitor and a first latching comparator, the first latching comparator including a first free input, a second free input and, a free output; and
configuring the first set of switches and the second set of switches to operate in either a charging configuration or a decision configuration, wherein in the charging configuration the first set of switches is in a closed state to allow current to flow from the power supply to the first capacitor, and the second set of switches is in an open state to prevent current from flowing from the first capacitor to the first latching comparator, the charging configuration further causing the first latching comparator to reset, and in the decision configuration the first set of switches is in the open state to prevent current from flowing from the power supply to the first capacitor, and the second set of switches is in the closed state to allow current to flow from the first capacitor to the first latching comparator to power the first latching comparator to perform a comparison of a first input received via the first free input to a second input received via the second free input and provide an output based on the comparison via the free output.

12. The method of claim 11, further comprising:
coupling a third set of switches to the power supply and a second capacitor;
coupling a fourth set of switches to the second capacitor and a second comparator; and
configuring the third set of switches and the fourth set of switches to operate in either the charging configuration or the decision configuration, wherein in the charging configuration the third set of switches is in the closed state to allow current to flow from the power supply to the second capacitor, and the fourth set of switches is in the open state to prevent current from flowing from the second capacitor to the second comparator, and in decision configuration the third set of switches is in the open state to prevent current from flowing from the power supply to the second capacitor, and the fourth set of switches is in the closed state to allow current to flow from the second capacitor to the second comparator.

* * * * *